(12) United States Patent
Lien et al.

(10) Patent No.: US 12,731,642 B2
(45) Date of Patent: Sep. 8, 2026

(54) ELONGATED CAPACITORS IN 3D NAND MEMORY DEVICES

(71) Applicant: Micron Technology, Inc., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 18/405,049

(22) Filed: Jan. 5, 2024

(65) Prior Publication Data

US 2024/0249772 A1 Jul. 25, 2024

Related U.S. Application Data

(60) Provisional application No. 63/440,011, filed on Jan. 19, 2023.

(51) Int. Cl.

| | |
|---|---|
| ***G11C 16/04*** | (2006.01) |
| ***G11C 5/06*** | (2006.01) |
| ***G11C 16/30*** | (2006.01) |

(52) U.S. Cl.
CPC .......... *G11C 16/0483* (2013.01); *G11C 5/063* (2013.01); *G11C 16/30* (2013.01)

(58) Field of Classification Search
CPC ..... G11C 16/0483; G11C 5/063; G11C 16/30; G11C 5/025; G11C 5/141; G11C 5/143; H10B 41/20; H10B 43/20
See application file for complete search history.

(56) References Cited

U.S. PATENT DOCUMENTS

| | | | | |
|---|---|---|---|---|
| 9,659,954 | B2 * | 5/2017 | Kim | H10B 43/10 |
| 10,629,675 | B1 * | 4/2020 | Nishikawa | H01L 23/5226 |
| 2021/0143096 | A1 * | 5/2021 | Yun | H01L 23/5223 |

* cited by examiner

*Primary Examiner* — Allison Bernstein
(74) *Attorney, Agent, or Firm* — Lowenstein Sandler LLP

(57) ABSTRACT

A semiconductor device can include a substrate of semiconductor material and multiple stacks of memory cells disposed within the substrate. Each of the stacks can include a conductive string that connects memory cells to a bitline where each memory cell is located at an intersection of the conductive string and a wordline. The device can also include capacitor having a cylindrical body disposed between two adjacent stacks of memory cells where the capacitor includes an inner conductive layer and an outer conductive layer at least partially surrounding the inner conductive layer, where the inner conductive layer and the outer conductive layer are separated by a dielectric layer. The device can further include a power supply line conductively connected to an end of the capacitor at a base of the cylindrical body.

19 Claims, 7 Drawing Sheets

ELONGATED CAPACITORS IN 3D NAND MEMORY DEVICES

REFERENCE TO RELATED APPLICATIONS

This application claims the priority benefit of U.S. Provisional Application No. 63/440,011, filed Jan. 19, 2023, which is incorporated by reference herein.

TECHNICAL FIELD

Embodiments of the disclosure generally relate to memory sub-systems, and more specifically, relate to capacitors in memory devices of a memory sub-system for managing power loss.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
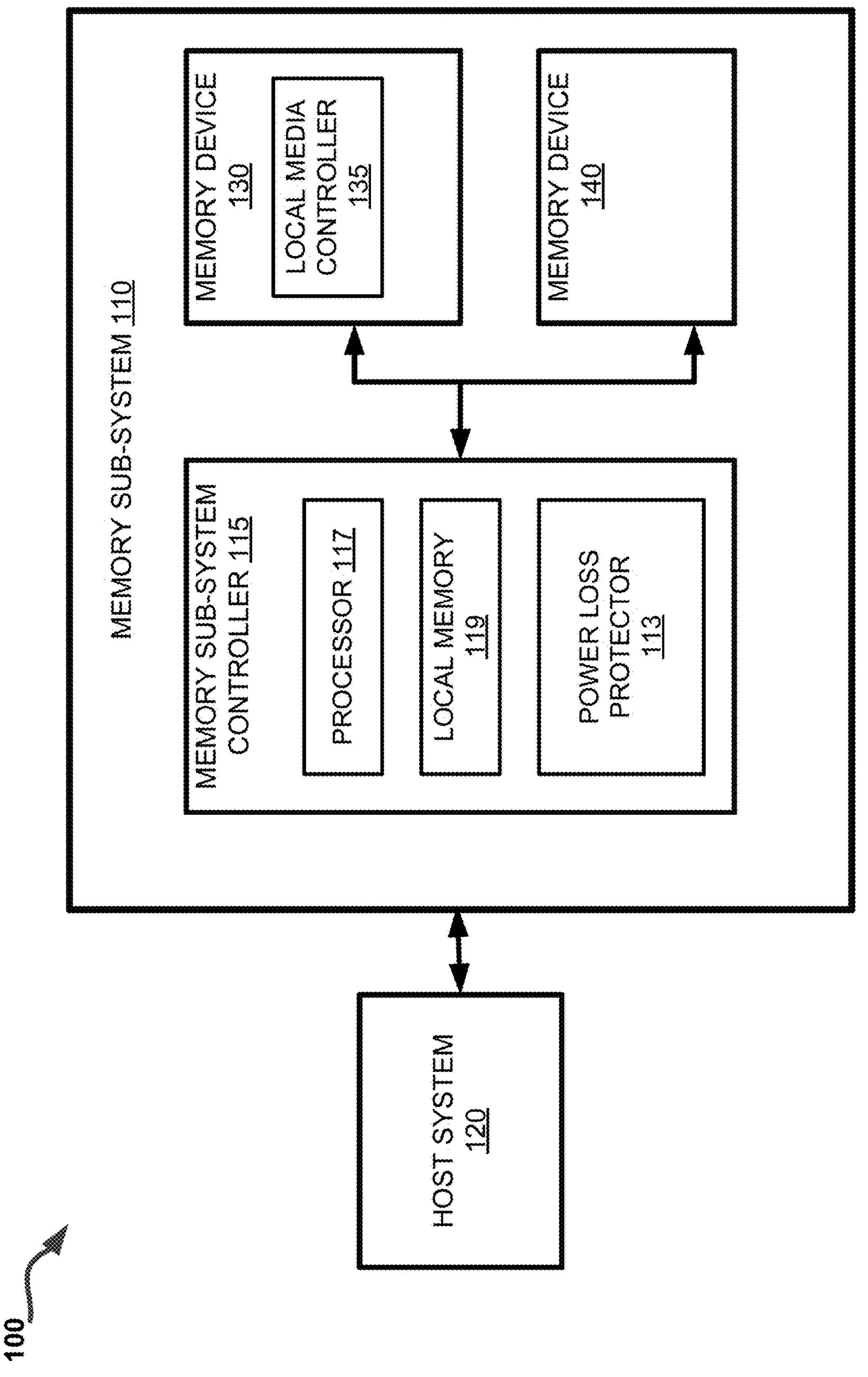
FIG. 1 illustrates an example computing system that includes a memory sub-system in accordance with some embodiments of the present disclosure.

Aspects of the present disclosure are directed to elongated capacitive structures in three dimensional arrays in memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can include one or more planes. For some types of non-volatile memory devices (e.g., NAND devices), each plane can include of a set of physical blocks. In some embodiments, each block can include multiple sub-blocks. Each block can include a set of pages. Each page can include set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or a three-dimensional grid. Memory cells can be formed onto a silicon wafer in an array of columns connected by conductive lines (also hereinafter referred to as bitlines, or BLs) and rows connected by conductive lines (also hereinafter referred to as wordlines or WLs). A wordline can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

In some devices, the array of memory cells for NAND flash memory can be arranged such that the control gate of each memory cell of a row of the array is connected together to form an access line (e.g., a wordline). Columns of the array can include conductive strings (referred to as NAND strings) of memory cells connected together in series between a pair of select gates (e.g., a source select transistor and a drain select transistor). Each source select transistor can be connected to a source, while each drain select transistor can be connected to a data line (e.g., a column bitline). In these devices, each bitline can be connected to multiple conductive NAND strings where each memory cell is located at an intersection of the string and a wordline. The array can be arranged in rows (each corresponding to a wordline) and columns (each corresponding to a bitline). Each column may include a string of series-connected memory cells (e.g., non-volatile memory cells), such that each bitline might connect together one or more NAND strings. Each NAND string might be connected (e.g., selectively connected) to a common source and might include one or more memory cells (i.e., one or more memory cells can be directly connected to each NAND string that is, in turn, directly connected to a bitline). The memory cells of each NAND string can be connected in series between a select gate (e.g., a field-effect transistor) that may be a source select transistor, commonly referred to as select gate source, and a select gate that may be a drain select transistor, commonly referred to as select gate drain.

In some systems that utilize memory devices, there can be a delay between the time that data is sent to be stored on a memory device and the time that the data actually gets recorded on the medium of the memory device. Similarly, there can be a delay between the time that data is requested to be retrieved from the memory device and the time it is actually received by the requesting component. This can occur due to the data having to pass through other components of the system before arriving at its destination and due to the latency of the read and write operations being executed on the medium of the memory device.

As a result of this delay, while there is still data, that was either requested or transmitted, still making its way through the other components of a system it is possible that the system or a memory device in a system may experience a power loss (PL) event, such as an asynchronous power loss (APL). For example, there may be data pending in a component to be written or retrieved when the PL occurs. Some approaches simply consider this in-transit data to be lost, often irretrievably. In many cases, in particular where memory device is a volatile memory device such situation can lead to inevitably losing the data when the power is lost since volatile memory devices depend on power being maintained to be able to retain data. Notably, if a power loss event occurs while there is critical system data or metadata in-flight and it is not saved in a non-volatile medium or securely retrieved by another component before complete power loss, it can be lost. The loss of such critical data or metadata can lead to loss of integrity for already recorded data, data corruption, increased latency, and performance degradation in various types of non-volatile memory devices. However, memory devices that include non-volatile media allow for the possibility of in-transit data being saved before power is completely lost in a computing system.

Some systems with non-volatile media devices can use additional components that include added circuitry with capacitors that can provide power to the components of the system when the primary source of power is lost or when a power loss event is otherwise experienced (e.g., during an APL). However, the capacitor size, available space in the memory device die packaging, memory device enclosure size, and capacitor energy storage capacity can be very limited in many cases. Moreover, to make use of the sustaining power of capacitors in some cases, additional electronic components, additional circuitry and chips that take up space and increase the resulting size of the memory device are often relied on.

Aspects of the present disclosure address the above and other deficiencies by using a memory sub-system that includes a memory device that has capacitive structures embedded between the data storing elements of the storage medium. More specifically, embodiments of the disclosure include memory devices with arrays of memory cells interspersed with capacitive structures. In some embodiments, elongated capacitive structures can be disposed in the available spaces (e.g., slits) between conductive strings of stacked memory cells. Each of the stacks can include two or more adjacent memory cells sharing a common conductive channel (i.e., the conductive string) that extends at a non-zero angle relative to both the bitline and the wordline respectively connected to each of those memory cells. Thus, elongated capacitors can be positioned in material that otherwise serves to isolate stacks of memory cells from one another. Each of these elongated capacitors can have an end that is connected (e.g., directly or through another electrical component such as a diode or a transistor) to a conductive line leading to a power source and another end that is grounded. During the operation of the memory device, the capacitive structure can be provided power by a controller of the memory device so the capacitive structure accumulates and retains electric charge. Upon the occurrence of a PL event such as an APL, the capacitive structures can be triggered (e.g., automatically or through a controller) to discharge and provide power to the remaining components of the memory device (e.g., the memory cells) to permit in-transit or other data to be recorded so that it can be stored and saved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. The host system 120 can provide data to be stored at the memory sub-system 110 and can request data to be retrieved from the memory sub-system

110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dies and channels to form management units (MUs).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 can include a substrate of semiconductor material. The substrate can refer to an initial surface or layer in a semiconductor device on which reagents can combine to precisely build up chemical and physical structures or within which structures can be etched or deposited. For example, the substrate can be formed at least in part from polysilicon. The substrate can be made of a semiconductor material on which or within which structures, whose geometry defines their electrical properties, can be formed. To form the structures, in some implementations, the substrate can be either etched or have portions of material removed to form cavities, trenches, slits etc. In other implementations, the substrate can act as a receiving surface for deposited layers of various materials to form the structures described herein.

In some embodiments, arrays of interconnected memory cells can be disposed within the substrate. For example, the memory cells can be arranged in stacks such that each stack includes a conductive string connecting multiple NAND memory cells to a bitline and to each other. Each memory cell can be located at an intersection of the conductive string and a wordline in an array on the memory device 130.

In some embodiments, the memory device 130 can include one or more capacitive structures (referred to as "capacitors") that can accumulate charge and, thereafter, discharge to provide power to other components of the memory device 130. Each capacitor can be located between adjacent stacks of memory cells (e.g., within the substrate of the memory device 130). In some embodiments, the capacitor can include two conductive layers separated by a gap (e.g., separated by a vacuum or another material within the gap). For example, the capacitor can have a cylindrical shape and can have a cylindrical body that includes an inner conductive layer and an outer conductive layer. The outer conductive layer can partially or completely surround the inner conductive layer.

In the same or other embodiments, one end of the capacitor (i.e., elongated capacitive structure) can be conductively connected to a power supply line (e.g., an electricity source line). For example, the power supply line can be conductively connected to an end of the capacitor at a base of the cylindrical body of the capacitor. In some embodiments, the power supply line can conduct power to the capacitor to collect and accumulate charge. In the same or other embodiments the power supply line can conduct discharged electricity from the capacitor to one or more other components of the memory device 130.

In some embodiments, the memory sub-system 110 can include a power loss protector 113 that can detect an impending PL event and modify the execution of commands and the transfer of data in the memory sub system 110 to ensure the integrity of the data saved on memory device 130 and to prevent the loss of critical system data and metadata. By altering the data traffic flow in the memory sub-system 110 as well as the speed and order of the execution of commands on the memory device 130, the power loss protector 113 can use the power provided from one or more of the capacitive structures to prioritize the execution of pending commands as well as an in-transit data to be saved before a complete loss of power occurs. In some embodiments, the power loss protector 113 forms at least a portion of one or more components including a power loss detection circuit, the memory device 130, the memory sub-system controller 115, and the local media controller 135. In some embodiments, the memory sub-system controller 115 can include at least a portion of a power loss detection circuit, the memory device 130, the memory sub-system controller 115, and the local media controller 135. In some embodiments, the power loss the power loss protector 113 is part of the host system 110, an application, or an operating system. In other embodiments, local controller 135 includes at least a portion of the power loss protector 113 and is configured to perform the functionality described herein. In particular, the power loss protector can control the provision of power to the capacitive structures to charge them as well as to trigger their discharge to receive power from them during a PL event. Further details pertaining to the capacitive structures are provided below with further reference to FIGS. 2-5.

Figure 2:
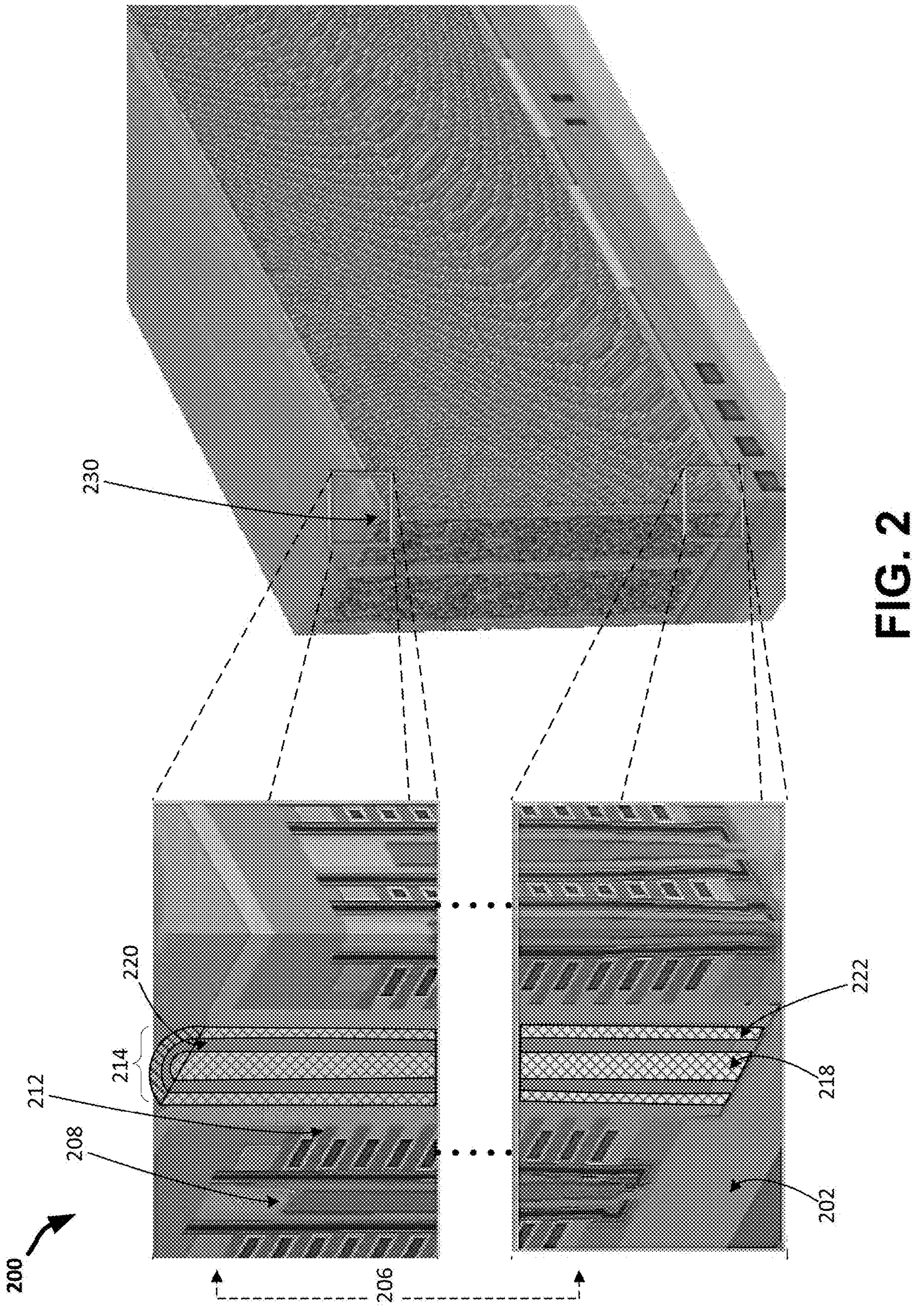
FIG. 2 depicts a cross-sectional perspective view of a three-dimensional diagram of a memory device with a capacitive structure in accordance with some embodiments of the present disclosure.

FIG. 2 is a three-dimensional diagram showing a cross-sectional perspective view of a portion 200 of a memory device 130 with a capacitive structure 214 in accordance with some embodiments of the present disclosure. In some embodiments, the memory device 130 can include a substrate 202 of semiconductor material. In some embodiments, one or more stacks 206 of not-and (NAND) memory cells can be disposed within the substrate 202. In other embodiments, one or more stacks 206 of NAND memory cells can be formed on top of or partially embedded in the substrate 202. In the same or other embodiments, each stack 206 can include a conductive string (e.g., a conductive metal channel) 208 connecting one or more of NAND memory cells to a bitline as shown in more detail below with reference to FIGS. 3-5. Each of the NAND memory cells can be located at an intersection of the conductive string 208 and a wordline 212.

In the various embodiments, adjacent stacks 206 of memory cells can be separated and isolated from each other by a slit 230 (also referred to as a trench). An elongated capacitive structure 214 can be located within such a slit 230 partially or fully extending through the length of the slit. In some embodiments, the capacitive structure 214 can be oblong and take the shape of an elongated irregular prism or a substantially regular prism (e.g., a parallelepiped, a rectangular prism, a cylinder etc.). For example, a capacitor 214 having a substantially cylindrical body can be disposed between two adjacent stacks 206 of memory cells. In some embodiments, the capacitor 214 can include two conductive layers. For example, the capacitor 214 can an inner conductive layer 218 and an outer conductive layer 222. While in some embodiments the outer conductive layer 222 can at least partially surround the inner conductive layer 218, in other embodiments the outer conductive layer 222 can surround an entire surface of the inner conductive layer 218. The inner conductive layer 218 and the outer conductive layer 222 can be separated by a dielectric layer 220. For example, the dielectric layer can formed of a suitable material such as $SiO_2$, $Si_3N_4$, $SiO_xN_y$, SiC, SiCO, SiCOH, and SiCH compounds; the foregoing silicon-containing materials with some or all of the Si replaced by Ge; inorganic polymers; hybrid polymers; organic polymers such as polyamides; carbon-doped oxides; inorganic oxides; other carbon-containing materials; and organo-inorganic materials such as spin-on glasses and silsesquioxane-based materials. In some embodiments inner conductive layer 218 and the outer conductive layer 222 can be separated by air, a dielectric gas, or by a vacuum. The relative positioning of the capacitive structures and memory cell stacks of the various embodiments can be further understood with reference to FIGS. 3A-3B.

Figure 3A:
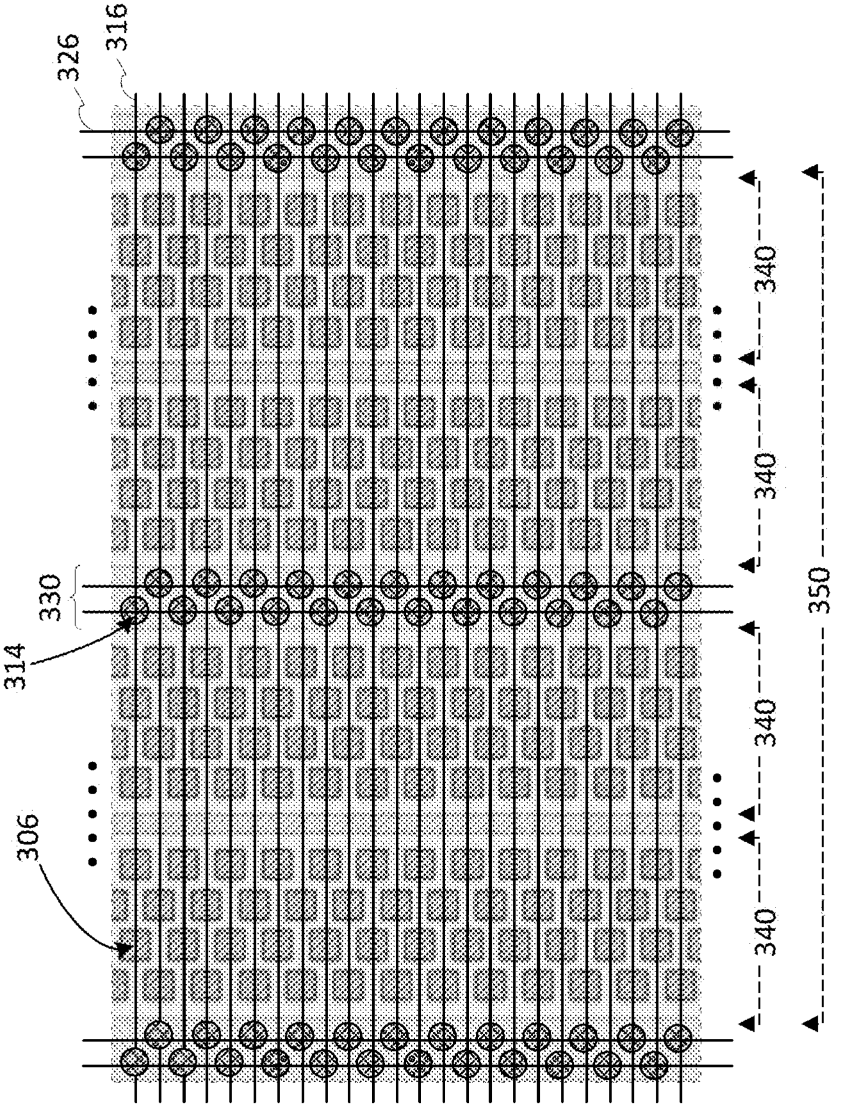
FIG. 3A depicts a top planar view of a cross-section of a memory device with capacitive structures in accordance with some embodiments of the present disclosure.
Figure 3B:
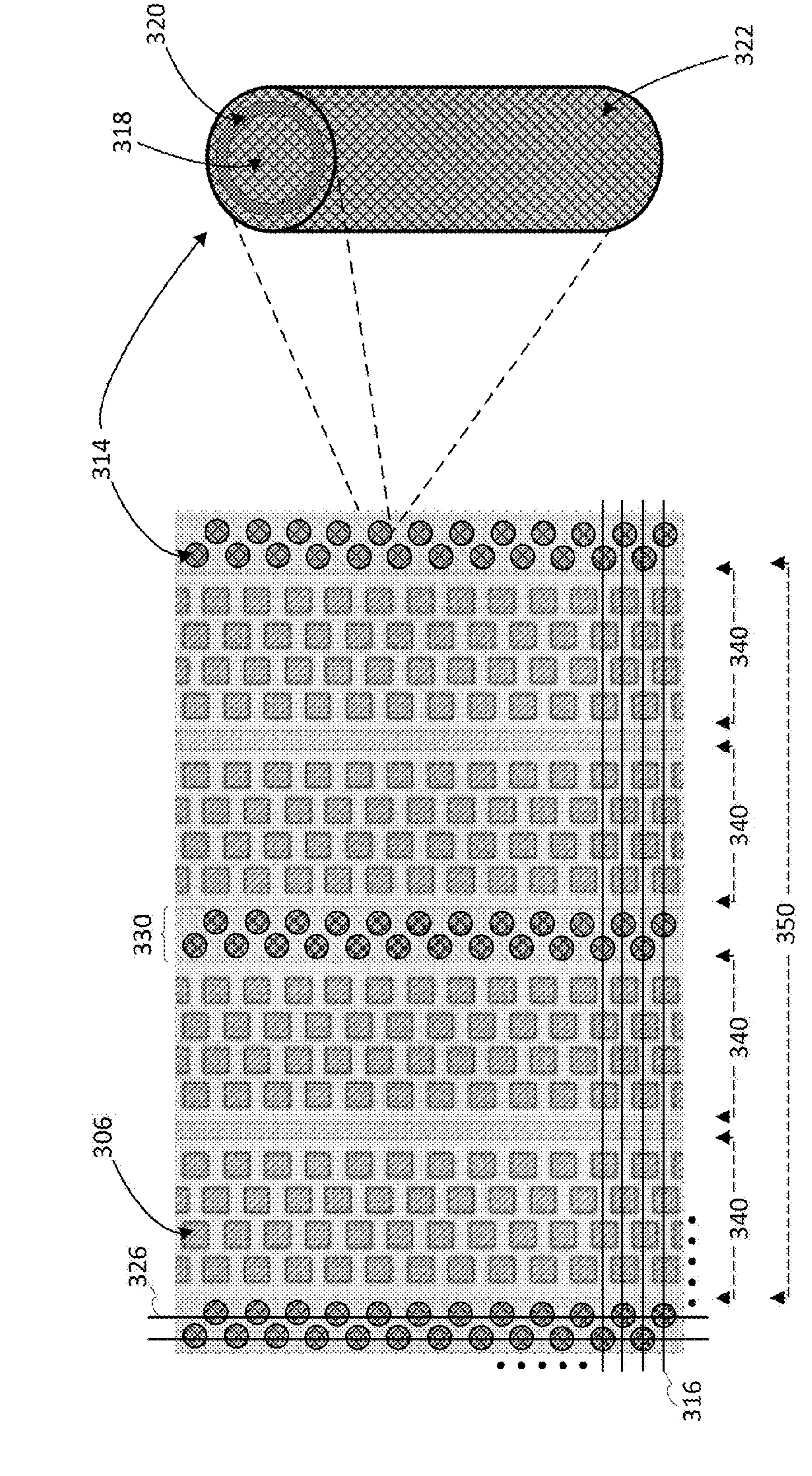
FIG. 3B depicts a top planar view of a cross-section of a memory device with capacitive structures and a perspective view of a capacitive structure in accordance with some embodiments of the present disclosure.

FIGS. 3A and 3B both show a top planar view of a cross-section of a memory device 300A, 300B with capacitive structures 314 and FIG. 3B further shows a perspective view of one of the capacitive structures 314 in accordance with some of the described embodiments. The memory device 300A, 300B can include multiple stacks 306 of memory cells arranged in arrays which form sub-blocks 340. Multiple sub-blocks together can form blocks 350 within the arrays of memory cells on the memory device.

In some embodiments, some of the adjacent stacks 306 of memory cells can be separated by a slit 330. The slit 330 can both physically and electrically isolate the adjacent memory cells from each other. Furthermore, multiple capacitive structures 314 can be located within each of the slits 330. In the various embodiments, the bitlines 316 that connect to each one of the memory cell stacks 306 (e.g., via the respective NAND cell strings) can also pass over the capacitive structures 314.

In the various embodiments, a power supply line 326 can be conductively connected to one or more of the capacitive structures 314 of the memory device. For example, the power supply line 326 can be connected to each of the capacitors 314 at one of the respective capacitor's ends. In embodiments having oblong capacitors, the power supply line 326 can be connected to one of the bases of the oblong shape such that that the power supply line 326 can be conductively connected to the inner conductive layer 318 or the outer conductive layer 320. In embodiments where the capacitors are cylindrically shaped, the power supply line 326 can be conductively connected to one of the bases of the cylindrical body such that the inner conductive layer 318 or the outer conductive layer 320 are in direct electrical contact with it. In the various embodiments, the layer of the capacitive structure that is not connected to the power supply line 326 can be connected to a grounded conductive component.

In some embodiments, the power supply line 326 can be conductively connected to the inner conductive layer 318 at the base of the cylindrical body and the outer conductive layer 322 can be electrically grounded. In other embodiments, the power supply line 326 can be conductively connected to the outer conductive layer 322 at the base of the cylindrical body and wherein the inner conductive layer 318 can be electrically grounded. Furthermore, in the same or other embodiments, the inner conductive layer 318 and the outer conductive layer 322 can be separated by a vacuum, air, or another material layer 318 (e.g., a dielectric layer). Additional details with respect to the connections between the capacitive structures 314 and the conductive lines can be understood with further reference to FIG. 3.

Figure 4:
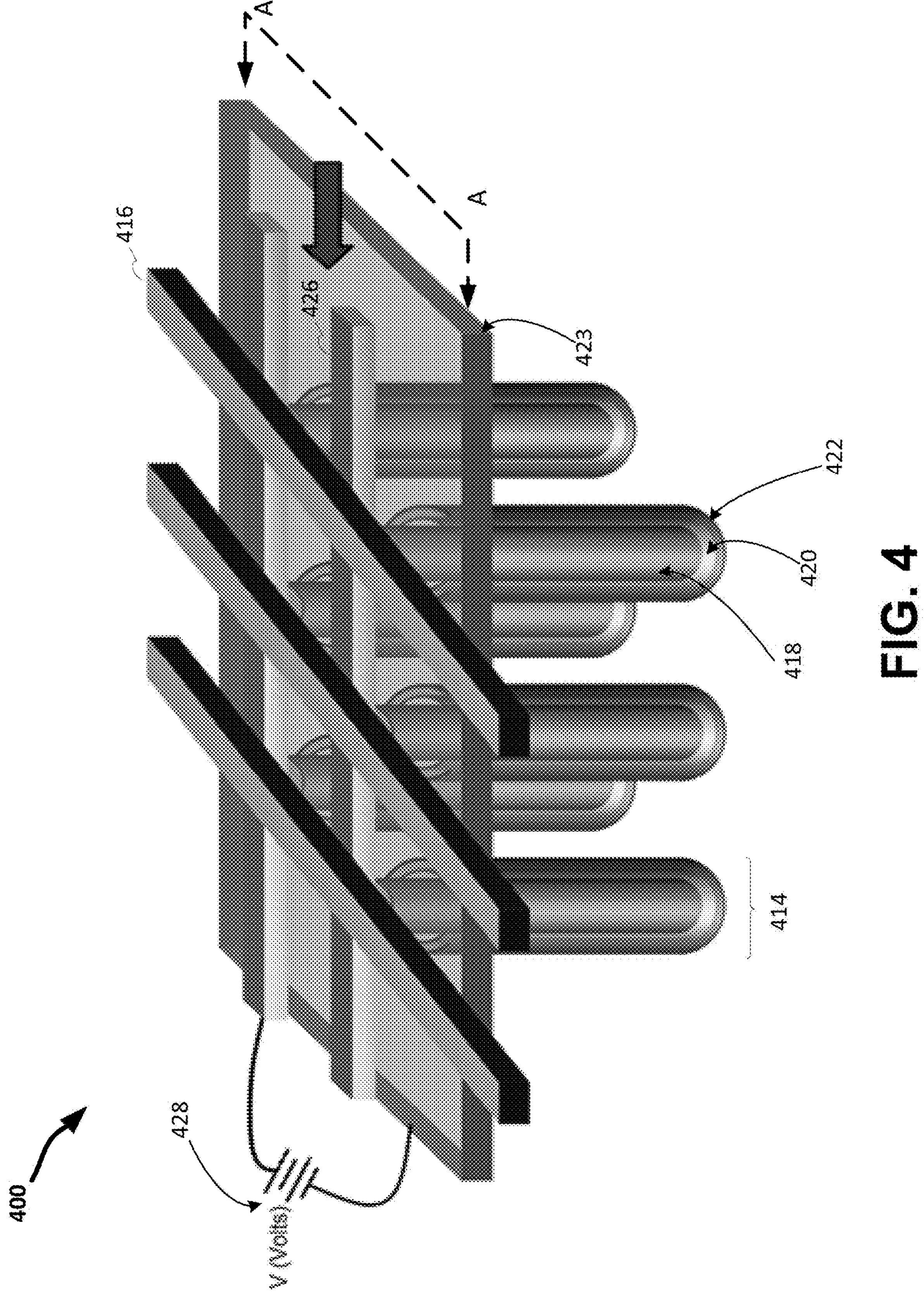
FIG. 4 illustrates a cutaway perspective view of a portion of a memory device with capacitive structures in accordance with some embodiments of the present disclosure.

FIG. 4 shows a cutaway perspective view of a portion of a memory device 400 with capacitive structures 414 shown relative to other connective elements and layers in accordance with some embodiments of the present disclosure. As previously noted, the power supply line 426 can be conductively connected to one of the layers (e.g., the inner conductive layer 318, or the outer conductive layer 322) at one of the ends of the oblong capacitive structure 314 such that one layer (e.g., inner conductive layer 418 or the outer conductive layer 422) is connected to a power source 428 while the other layer (e.g., inner conductive layer 418 or the outer conductive layer 422) can be electrically grounded. In the various embodiments the capacitive structures 414 can include multiple conductive and non-conductive layers. For example, a substantially cylindrical capacitor 414 can include an exterior conductive layer 422, which surrounds a dielectric layer 420, which, in turn, surround an interior conductive layer 418. In some embodiments, the capacitive structures 414 can include more layers, for example, the interior conductive layer 418, can further surround another dielectric layer. In these embodiments, the innermost dielectric layer can provide structural support for the capacitive structure 414.

In the various embodiments, the layers 418, 420, 422 of the capacitive structures 414 can be substantially tubular. For example, the inner conductive layer 418, the dielectric layer 420, and the outer conductive layer 422, can each be substantially tubular and can take the shape of a cylinder, a rectangular prism, an irregular prism, and other similar oblong shapes that extend at least partially through the depth of a slit between stacks of memory cells. These elongated, oblong, tubular, prismatic, and similar shapes of each of the layers of the capacitive structures 414 described herein can be formed by sequential deposition of the layers within the slit by chemical vapor deposition, physical vapor deposition, plasma enhanced chemical vapor deposition, and other similar atomic and molecular deposition techniques.

In some embodiments, the power supply line 426 can be a metal stripe extending at an angle relative to one or more memory stacks or relative to one or more capacitive structures 414. For example, the power supply line 426 can be a metal stripe that extends over one or more memory cell stacks or one or more capacitive structures 414 in a direction that is perpendicular to either the one or more memory cell stacks or the one or more capacitive structures 414. The various embodiments can include one or more of such power supply lines 426. One or more bitlines 416 can extend over the one or more memory cell stacks or the one or more capacitive structures 414 in a direction that is angled relative to both the memory cell stacks and the capacitive structures 414 as well as relative to one or more of the power supply lines 426. For example, one or more bitlines 416 can extend over the one or more memory cell stacks or the one or more capacitive structures 414 substantially perpendicularly relative to both the memory cell stacks and the capacitive structures 414 as well as substantially perpendicularly relative to one or more of the power supply lines 426.

Furthermore, power supply lines 426 can be connected to a power source such as voltage source 428. In some embodiments, the voltage source 428 can form a circuit (i.e., be electrically connected with another electrically conductive layer such as planar layer 423. In some of these embodiments, the inner conductive layer 418 of a capacitive structure 414 can be directly conductively connected to power supply line 426 while the outer conductive layer 422 can be directly conductively connected to conductive planar layer 423. In other embodiments, the inner conductive layer 418 of a capacitive structure 414 can be directly conductively connected to conductive planar layer 423 while the outer conductive layer 422 can be directly conductively connected to power supply line 426.

In the various embodiments described, each of the conductive layers can be entirely or partially formed of a metal. For example, all of the layers can be formed of a metal material. In some cases, some of the conductive layers can be formed completely of metal material while other conductive layers are formed partially out of metal material. In some embodiments, one or more of the conductive layers can be formed of a composite material, an alloy, a mixture material, or a combination of the foregoing. For example, the conductive elements and the conductive layers can be formed of metals and composites such as Al, TiN, W, Cu, Ti, Ag, Au, etc. in some embodiments, the capacitor (i.e., oblong capacitive structure 414) can include a portion of each of the inner conductive layer 418 and the outer conductive layer 422 that is formed of a metal material. This partially metallic capacitor 414 can be disposed within a slit of semiconductor material between the two adjacent stacks of memory cells such that the capacitor 414 extends at least partially through the depth of the slit between a proximal end of the slit and a distal end of the slit relative to the power supply line 426.

Thus, in some embodiments, a semiconductor memory device can include a substrate of semiconductor material with multiple stacks of memory cells disposed within the substrate. The memory device can include a substantially oblong capacitor 414 disposed between two adjacent stacks of memory cells where the capacitor includes at least two tubular conductive layers 422, 418. Each of the at least two tubular conductive layers 422, 418 can be entirely or partially formed of a metal material. In these or other embodiments, the power supply line 426 can be conductively connected to one of the tubular conductive layers 422, 418 and the two tubular conductive layers 422, 418 are separated by a dielectric layer 420.

In some of these embodiments, the power supply line 426 can be conductively connected to one of the at least two tubular conductive layers and another layer of the at least two tubular conductive layers can be electrically grounded. For example, the power supply line 426 can be conductively connected to an inner tubular conductive layer 418 and the outer tubular conductive layer 422 can be electrically grounded. In another example, the power supply line 426 can be conductively connected to an outer tubular conductive layer 422 and the inner tubular conductive layer 418 can be electrically grounded (e.g., by being connected to a grounded electrical connection at the end of the capacitor 414 opposite the power supply line 426).

In these or other embodiments, the power supply line can be a conductive metal stripe that extends at an angle (e.g., perpendicular) over one or more of stacks of memory cells and over one or more capacitors 414. Although some slits between stacks of memory cells can include capacitors 414, other slits might not include them. Where the oblong capacitors 414 are present in a slit, the oblong capacitors 414 can each be located within the slit of semiconductor material present between the two adjacent stacks. Each oblong capacitor 414 can extend partially or completely through the depth of the slit where the depth of the slit is defined to be the length between a proximal end of the slit and a distal end of the slit relative to the power supply line 426. Further details concerning the relative orientation of the elements and the layers described can be understood with reference to FIGS. 5A and 5B which show embodiments seen in a sectional view as seen in the direction of the A-A section shown in FIG. 4.

Figure 5A:
FIG. 5A depicts a sectional A-A view of a memory device structure of FIG. 4 in accordance with some embodiments of the present disclosure.
Figure 5A:
Figure 5A:
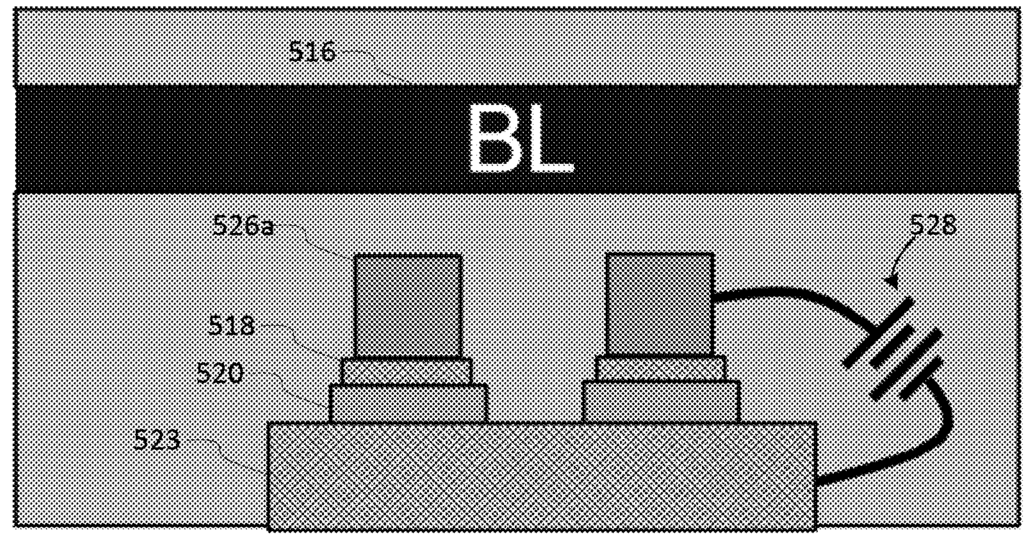

FIG. 5A depicts a sectional A-A view of a memory device structure of FIG. 4 in accordance with some embodiments of the present disclosure that include separate conductive source lines **526*a* connected to each capacitive structure. In some embodiments, the substantially planar conductive layer 523 can be in electrical contact with an outer layer of the capacitive structure. In these embodiments, the outer conductive layer of the capacitive structure can be separated from the inner conductive layer 518 by dielectric layer 520**.

Furthermore, in some embodiments, the substantially planar conductive layer 523 can be electrically grounded while the inner conductive layer 518 is electrically connected to a voltage source 528 via power supply line **526*a*. In the depicted embodiment, this is made possible by the inner conductive layer 518 extending further towards the power supply line 526*a* than the outer conductive layer does. Conversely, in other embodiments, the inner conductive layer 518 can be electrically grounded while the substantially planar conductive layer 523 is electrically connected to a voltage source 528 via power supply lines 526*a*. For example, the outer conductive layer can extend further towards the power supply line 526*a* to make a direct electrical connection while the inner conductive layer 518 can be recessed relative to the power supply line 526*a*** and extend further than the outer conductive layer at the other end of the capacitive structure to be electrically grounded.

In the various embodiments, the power supply lines **526*a* can be connected to a voltage source 528 and can form a circuit with the substantially planar layer 523. Notably, in these embodiments, each of the power supply lines 526*a* can be separated from a respective proximate bitline by a distance sufficient to prevent inadvertent leakage of current between the bitline and the power supply line 526*a***.

Figure 5B:
FIG. 5B depicts a sectional A-A view of a memory device structure of FIG. 4 in accordance with some embodiments of the present disclosure.
Figure 5B:
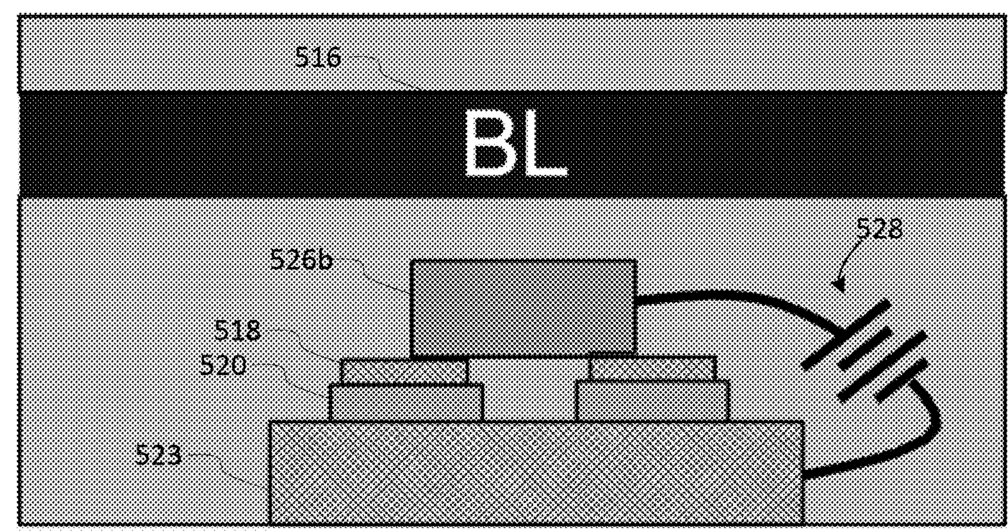

FIG. 5B depicts a sectional A-A view of a memory device structure of FIG. 4 in accordance with some embodiments of the present disclosure that include a conductive source lines **526*b* each connected to two or more capacitive structures. In some embodiments, the substantially planar conductive layer 523 can be in electrical contact with an outer layer of one or more of the capacitive structures. In these or other embodiments, the outer conductive layer of the capacitive structure can be separated from the inner conductive layer 518 by one or more dielectric layers 520**.

Furthermore, in some embodiments, the substantially planar conductive layer 523 can be electrically grounded while the inner conductive layers 518 of two or more capacitive structures are electrically connected to a voltage source 528 via power supply line **526*b*. In the depicted embodiment, this is made possible by the inner conductive layers 518 extending further towards the power supply line 526*a* than the outer conductive layers do. Conversely, in other embodiments, the inner conductive layers 518 can be electrically grounded while the substantially planar conductive layer 523 is electrically connected to a voltage source 528 via power supply lines 526***b*. For example, the respective outer conductive layer of each of two or more capacitive structures can extend further towards the power supply line 526*b* to make a direct electrical connection with the power supply line 526*b* while the respective inner conductive layers 518 of each of two or more capacitive structures can be recessed relative to the power supply line 526*b* and can extend further than the respective outer conductive layers at the other (i.e., opposite) end of the respective capacitive structures to be electrically grounded.

In the various embodiments, the power supply lines 526*a* can be connected to a voltage source 528 and can form a circuit with the substantially planar layer 523. Notably, in these embodiments, each of the power supply lines 526*a* can be separated from a respective proximate bitline by a distance sufficient to prevent inadvertent leakage of current between the bitline and the power supply line 526*a*.

The embodiments depicted in the FIGS. 2-5 are illustrative examples and may not reflect the relative dimensions of the described components. Various dimensions and sizes of the described components are contemplated. For example capacitors capable of storing a target amount of charge to power the memory device during an occurrence of a PL event can be obtained by selecting corresponding dimensions for each of the oblong capacitive structures (e.g., cylindrical capacitors) based on their respective individual capacitances C. For such capacitors, their capacitance C can be defined by or approximated by $$C = \frac{2\pi\epsilon L}{\ln\frac{b}{a}}$$

where ε is the permittivity of the dielectric (i.e., the dielectric layer), L is the length of the substantially cylindrical capacitive structure, and b and a are respectively the outer and inner radius of substantially cylindrical capacitive structure.

Figure 6:
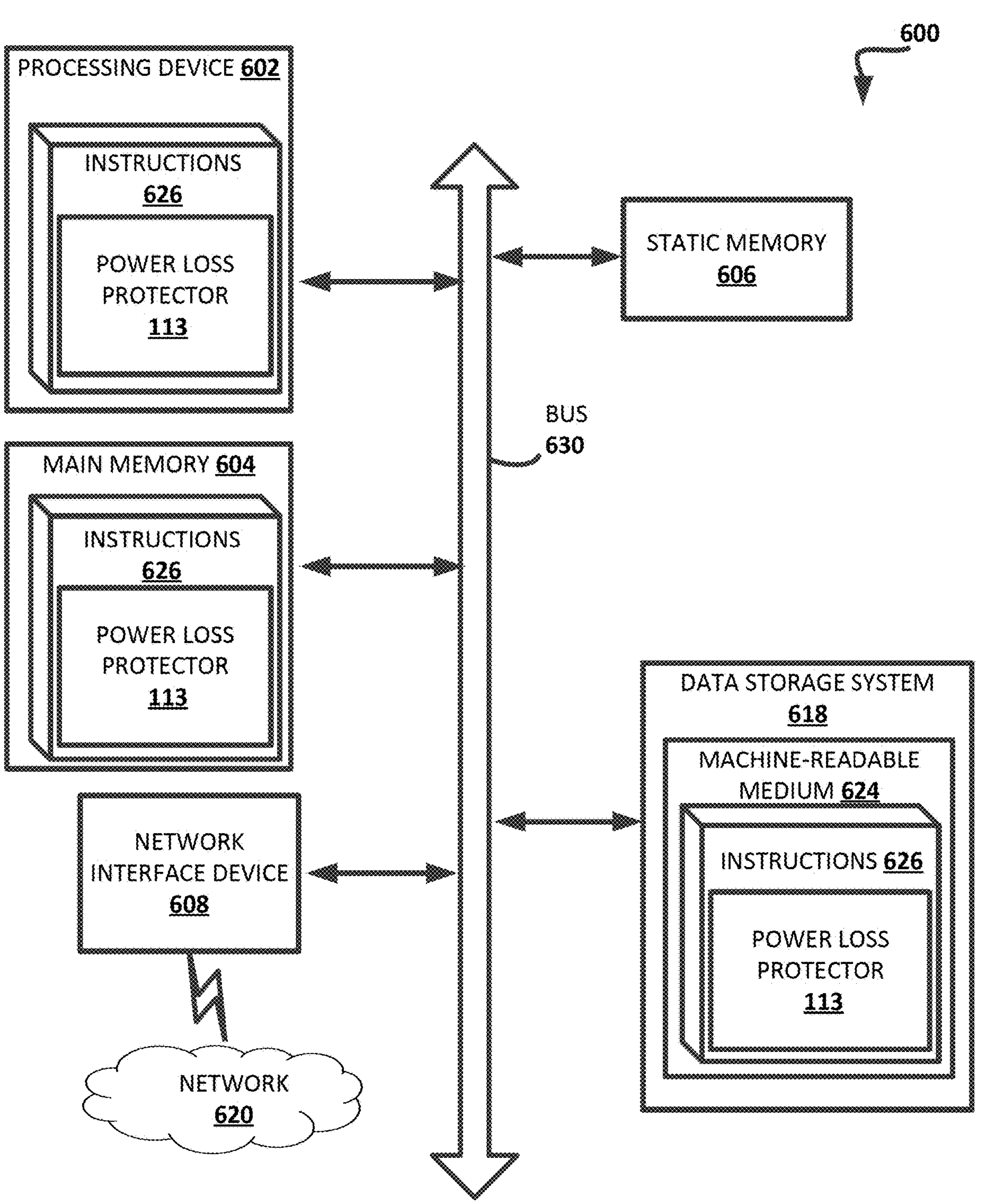
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power loss protector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a power loss protection component (e.g., the power loss protector 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A semiconductor device, comprising:

a substrate of semiconductor material;

a plurality of stacks of memory cells disposed within the substrate, each stack comprising a conductive string connecting a plurality of memory cells to a bitline, wherein each memory cell is located at an intersection of the conductive string and a wordline;

a capacitor having a body disposed between two adjacent stacks of the plurality of stacks, the capacitor comprising an inner conductive layer and an outer conductive layer at least partially surrounding the inner conductive layer, wherein the inner conductive layer and the outer conductive layer are separated by a dielectric layer; and a power supply line conductively connected to an end of the capacitor at a base of the body.

2. The semiconductor device of claim 1, wherein the memory cells are not-and (NAND) memory cells.

3. The semiconductor device of claim 1, wherein the power supply line is conductively connected to the inner conductive layer at the base of the body and wherein the outer conductive layer is electrically grounded.

4. The semiconductor device of claim 1, wherein the power supply line is conductively connected to the outer conductive layer at the base of the body and wherein the inner conductive layer is electrically grounded.

5. The semiconductor device of claim 1, wherein the power supply line is a metal stripe extending perpendicularly over the plurality of stacks.

6. The semiconductor device of claim 1, wherein the capacitor is disposed within a slit of semiconductor material between the two adjacent stacks, the capacitor extending at least partially through a depth of the slit between a proximal end of the slit and a distal end of the slit relative to the power supply line.

7. The semiconductor device of claim 1, wherein the body of the capacitor is cylindrical.

8. A semiconductor device, comprising:

a substrate of semiconductor material;

a plurality of conductive strings, each string connecting a stack of memory cells disposed within the substrate to a bitline, wherein each memory cell is located at an intersection of the string and a wordline;

a capacitive structure disposed between two adjacent stacks of memory cells, the capacitive structure comprising an inner conductive layer and an outer conductive layer that is concentric with the inner conductive layer, wherein the inner conductive layer and the outer conductive layer are separated by a dielectric layer; and a power supply line conductively connected to a base of the capacitive structure.

9. The semiconductor device of claim 8, wherein the memory cells are not-and (NAND) memory cells.

10. The semiconductor device of claim 8, wherein the power supply line is conductively connected to the inner conductive layer at the base of the capacitive structure and wherein the outer conductive layer is electrically grounded.

11. The semiconductor device of claim 8, wherein the power supply line is conductively connected to the outer conductive layer at the base of the capacitive structure and wherein the inner conductive layer is electrically grounded.

12. The semiconductor device of claim 8, wherein the power supply line is a metal stripe extending perpendicularly over the stack.

13. The semiconductor device of claim 8, wherein the capacitive structure is disposed within a slit of semiconductor material between the two adjacent stacks, the capacitive structure extending at least partially through a depth of the slit between a proximal end of the slit and a distal end of the slit relative to the power supply line.

14. The semiconductor device of claim 8, wherein the capacitive structure is shaped as a cylinder.

15. A semiconductor device, comprising:

a substrate of semiconductor material;

a plurality of stacks of memory cells disposed within the substrate;

a capacitor disposed between two adjacent stacks of memory cells, the capacitor comprising at least two tubular conductive layers separated by a dielectric layer; and a power supply line conductively connected to one tubular conductive layer of the at least two tubular conductive layers.

16. The semiconductor device of claim 15, wherein the power supply line is conductively connected to a first tubular conductive layer of the at least two tubular conductive layers and wherein a second tubular conductive layer of the at least two tubular conductive layers is electrically grounded.

17. The semiconductor device of claim 15, wherein the power supply line is a metal stripe extending perpendicularly over the plurality of stacks.

18. The semiconductor device of claim 15, wherein the capacitor is disposed within a slit of semiconductor material between the two adjacent stacks, the capacitor extending at least partially through a depth of the slit between a proximal end of the slit and a distal end of the slit relative to the power supply line.

19. The semiconductor device of claim 15, wherein the capacitor is substantially oblong.

* * * * *